(12) United States Patent
Sorland

(10) Patent No.: US 6,946,837 B2
(45) Date of Patent: Sep. 20, 2005

(54) METHOD FOR MEASURING THE CONTENT OF FAT/OIL IN MULTI COMPONENT SYSTEM

(76) Inventor: Geir H. Sorland, Hagebyveien 32, N-9404 Harstad (NO)

( * ) Notice: Subject to any disclaimer, the term of this patent is extended or adjusted under 35 U.S.C. 154(b) by 0 days.

(21) Appl. No.: 10/240,467

(22) PCT Filed: May 28, 2001

(86) PCT No.: PCT/NO01/00220

§ 371 (c)(1),
(2), (4) Date: Sep. 30, 2002

(87) PCT Pub. No.: WO01/92908

PCT Pub. Date: Dec. 6, 2001

(65) Prior Publication Data

US 2003/0167828 A1 Sep. 11, 2003

(30) Foreign Application Priority Data

May 28, 2001 (WO) .............................. PCT/NO01/00220

(51) Int. Cl.⁷ ............................................... G01V 3/00
(52) U.S. Cl. ...................................... 324/307; 324/309
(58) Field of Search ................................ 324/306–309, 324/303, 314, 320; 436/60, 173; 73/53.01, 53.02, 159

(56) References Cited

U.S. PATENT DOCUMENTS

| | | | | |
|---|---|---|---|---|
| 2,869,357 A | * | 11/1959 | Kritz ............................... | 73/32 |
| 3,040,562 A | * | 6/1962 | Fitzgrerld et al. .............. | 73/53 |
| 4,145,450 A | * | 3/1979 | Windder et al. ............. | 426/231 |
| 4,765,179 A | * | 8/1988 | Fuller et al. .................... | 73/53 |
| 4,785,245 A | * | 11/1988 | Lew et al. ................... | 324/308 |
| 4,785,246 A | * | 11/1988 | Sugimoto .................... | 324/318 |
| 5,008,204 A | * | 4/1991 | Stehling ....................... | 436/85 |
| 5,134,372 A | * | 7/1992 | Inoue .......................... | 324/309 |
| 5,322,682 A | * | 6/1994 | Bartzokis et al. ............... | 424/9 |
| 5,554,932 A | * | 9/1996 | Jeffs ........................... | 324/204 |
| 5,574,363 A | * | 11/1996 | Jagielinski ................... | 324/204 |
| 5,608,358 A | * | 3/1997 | Ziseki et al. ................... | 331/65 |
| 5,729,138 A | * | 3/1998 | Purdy et al. ................. | 324/309 |
| 5,792,668 A | * | 8/1998 | Fuller et al. ................. | 436/149 |
| 5,841,023 A | * | 11/1998 | Parker et al. ................... | 73/53 |
| 6,147,492 A | * | 11/2000 | Zhang et al. ................ | 324/309 |
| 6,147,502 A | * | 11/2000 | Fryer et al. .................. | 324/637 |
| 6,200,815 B1 | * | 3/2001 | Pasula .......................... | 436/63 |
| 6,275,040 B1 | * | 8/2001 | Zur ............................. | 324/320 |
| 6,317,696 B1 | * | 11/2001 | Clements et al. ............. | 702/50 |
| 6,373,249 B1 | * | 4/2002 | Kwok et al. ................. | 324/306 |
| 6,630,357 B2 | * | 10/2003 | Mirotchnik et al. ......... | 436/173 |
| 2002/0081742 A1 | * | 6/2002 | Mirotchnik et al. .......... | 436/60 |
| 2003/0009297 A1 | * | 1/2003 | Mirotchnik et al. .......... | 702/25 |
| 2003/0167828 A1 | * | 9/2003 | Sorland ..................... | 73/53.02 |

OTHER PUBLICATIONS

Ma et al., article "A Single–Scan Imaging Technique for Measurement of the relative Concentrations of Fat and Water Protons and Their Transverse Relaxation Times" Journal of Magnetic Resonance 125, 92–101 (1997).*
D. Hoult et al, "NMR Signal Reception: Virtual Photons and Coherent Spontaneous Emission", Concepts Magn Reson, 9:277–297 (1997).
W. Price, "Pulsed–Field Gradient Nuclear Magnetic Resonance as a Tool for Study Translational Diffusion: Part 1. Basic Theory", Concepts Magn Reson, 9:299–336 (1997).
P. Bottomley et al, "A Review of 1H Nuclear Magnetic Resonance Relaxation in Pathology: Are T1 and T2 Diagnostic?", Med. Phys., 14(1):1–37 (Jan./Feb. 1987).

* cited by examiner

*Primary Examiner*—Brij Shrivastav
*Assistant Examiner*—Tiffany A. Fetzner
(74) *Attorney, Agent, or Firm*—McHale & Slavin, P.A.

(57) ABSTRACT

The invention is a method for determination of the content of fat in a multicomponent system. The method applies nuclear magnetic resonance (NMR) for the detemination of fat/oil in for example fillets of fish, olives, paint or ice cream.

2 Claims, 3 Drawing Sheets

METHOD FOR MEASURING THE CONTENT OF FAT/OIL IN MULTI COMPONENT SYSTEM

RELATED APPLICATIONS

This application claims priority under 35 USC 385(c) from application PCT/NO 01/00220, filed May 28, 2001.

BACKGROUND OF THE INVENTION

The invention is a method for determining the amount of fat in a multicomponent system where water, sugar, protein or other components containing hydrogen maybe present. The method applies nuclear magnetic resonance (NMR) for determining the amount of fat/oil in for example fish, olives, paints, or dairy products.

DESCRIPTION OF THE PRIOR ART

There are several methods used for determining the content of fat/oil; In the Fosslet-, Soxhlet-, and Ethylacetate methods one adds solvents which extracts the fat/oil. By removing the solvent, one is left with the fat/oil which originally was found in the sample. These methods require well trained laboratory personnel and the use of toxic solvent which may damage the environment.

Another way to measure the fat/oil content is to use Near Infrared Reflectance (NIR) spectroscopy. This type of measurements require a lot of calibration work for a given system as the method is very sensitive to changes in the texture of the sample.

SUMMARY OF THE PRESENT INVENTION

An object of the present invention is to supply a robust method for determination of fat/oil in a generally multicomponent system. The method is fats, accurate, and it does not demand laboratory personnel who have specific knowledge with respect to the method.

Another object of this invention is achieved by placing the sample to be investigated in a homogeneous/static magnetic field, and exposing it to an oscillating magnetic field which, in combination with a magnetic field gradient over the sample, measures the nuclear magnetic moment of the protons, in a multipulsed field gradient spin-echo experiment (m-PFGSE), as one resolves the fat/oil-signal from the other components by their significant difference in mobility and/or transverse relaxation times.

DETAILED DESCRIPTION OF THE INVENTION

When placing hydrogen in an external magnetic field, the nuclear magnetic moment will align towards the direction of this field. The Hamiltonian for noninteracting nuclear magnetic spins in an external magnetic field can be written $$H = -\gamma \hbar I H(t) \tag{L1}$$

where $\gamma$=gyromagnetic ratio, $\hbar$=Planck's constant, I=spin operator and H(t)=external magnetic field. The time dependency of H(t) is included in order to make (L1) valid when the system is influenced by an oscillating magnetic field (RF-field) and magnetic field gradients (g). When the Hamiltonian, H(t), is constant and homogeneous (=Ho), the eigen values, the energy levels, of the hydrogen's nuclear spin may be written $$E = \pm \tfrac{1}{2}\gamma \hbar H_o = \pm \tfrac{1}{2}\hbar\omega_o \tag{L2}$$

The difference between the to energy levels is thus written $$\Delta E = \hbar\omega_o \tag{L3}$$

In thermal equilibrium a difference population between upper and lower level is given by the Boltzmann factor $$\frac{n_{upper}}{n_{lower}} = e^{-\frac{\hbar\omega}{kT}} \tag{L4}$$

where T is absolute temperature and k- Boltzmann's constant. The difference in population will generate a net nuclear magnetic moment which will depend on the content of hydrogen/proton. In thermal equilibrium the moment will be aligned with the external magnetic field. By imposing an oscillating magnetic field, RF-field, transverse to the external magnetic field Ho, transitions between the energy levels will occur (ref. 1). The direction of the net nuclear magnetic moment will then move away from thermal equilibrium with the external field. When the RF-field is switched off ,the system will exhibit characteristic relaxation times T1 (longitudinal relaxation) and T2 (transverse relaxation).

Figure 1:
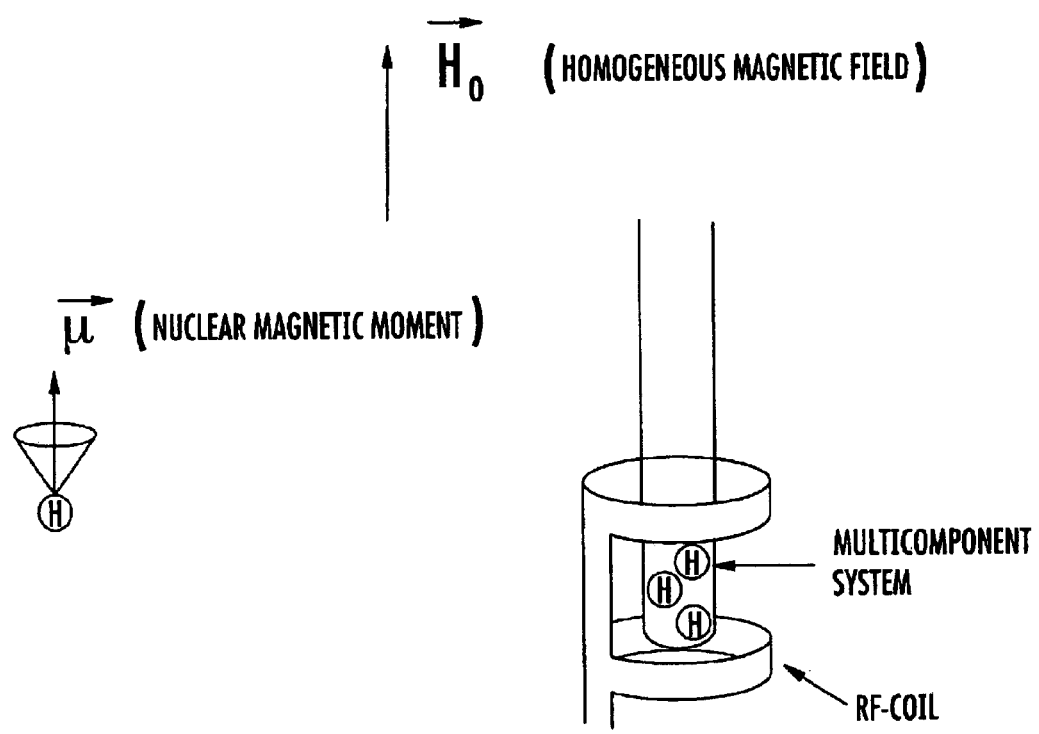
FIG. 1 illustrates a test sample in an NMR spectrometer.

The path back to thermal equilibrium in combination with an oscillating net nuclear magnetic moment transverse to Ho, will cause changes in the magnetic flux which can be recorded with the same RF-coil which was used to excite the system. The current induced in the coil will then be proportional to the number of hydrogen in the system, and from the intensity of the signal one may quantify the content of hydrogen in the system (FIG. 1).

One may record the mobility of the hydrogen by making use of a magnetic field gradient. This magnetic field gradient, g, imposes a position dependent frequency an the system, and with which the nuclear magnetic moment of the proton is oscillating in a plane transverse to Ho $$\omega = \gamma H_o + \gamma g z \tag{L5}$$

By using RF-pulses and magnetic field gradients in a NMR-diffusion experiment (ref.2), there is a dephasing of the net magnetic moment given by $$\phi = \gamma g(z_2 - z_1) \tag{L6}$$

$(Z_2-Z_1)$ is the distance the protons has moved during the NMR-diffusion experiment. For larger values on the mobility $(Z_2-Z_1)$, the induced current in the RF-coil, the NMR-signal, will decrease because of the dephasing.

When assuming a Gaussian distribution of diffusivities and monoexponential attenuation of the NMR-signal due to relaxation processes, the attenuation of the NMR-signal is written $$I = I_0 e^{-\frac{t_1}{T_2}} e^{-\frac{t_2}{T_1}} e^{-\gamma^2 g^2 D \int_0^t \left(\int_0^{t'} g(t'')dt''\right)^2 dt'} \tag{L7}$$

Figure 2:
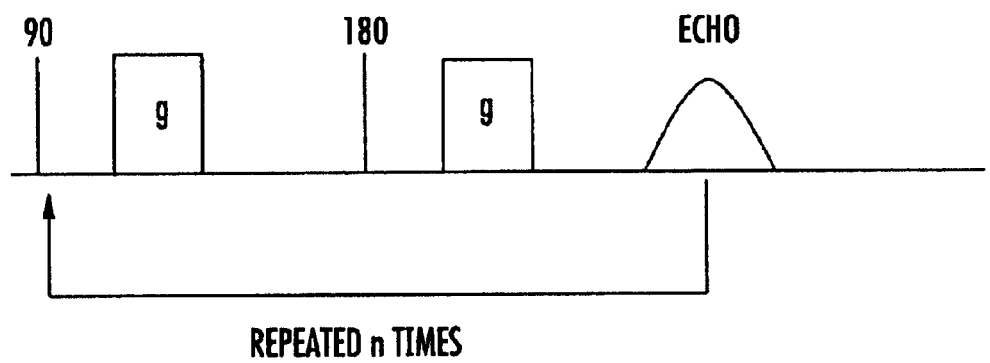
FIG. 2 is a representation of a signal arising from the m-PFGSE method.

$t_1$=duration the NMR-signal is influenced by transverse relaxation processes $t_2$=duration the NMR-signal is influenced by longitudinal relaxation processes
g(t")=total magnetic field gradient, external and internal.
D=diffusion coefficient
$T_1$=Characteristic longitudinal relaxation time
$T_2$=Characteristic transverse relaxation time
$I_o$=Initial intensity of the NMR-signal There are several ways to perform a diffusion experiment by NMR. Here a so-called multi-pulsed magnetic field gradient spin echo experiment is applied (m-PFGSE) (see FIG. 2). FIG. 2 displays the monopolar version. With this sequence it becomes unnecessary to perform extra correction for longitudinal relaxation processes, transverse relaxation processes, and the NMR-signal will be refocused with respect to internal magnetic field gradients. In addition, the uncertainty due to eddy current field is minimized as one is using the same gradient strength throughout the experiment.

The echo-attenuation for the m-PFGSE-sequence in FIG. 2 is written $$I = I_0 e^{-n\left[\frac{2\tau}{T_2} - \frac{2\tau^3}{3}\gamma^2 G_i^2 D\right]} e^{-n\left[\gamma^2 g^2 D\delta^2\left(\tau - \frac{\delta}{3}\right)\right]} \quad (L8)$$

Gi is the internal magnetic field gradient caused by changes in magnetic susceptibilities throughout the sample, g is the externally applied magnetic field gradient, $\delta$ is the gradient pulse length, and $\tau$ is the time interval between 90-degree RF-pulse and 180-degree RF-pulse.

By defining the unknown parameter $$K = \frac{2\tau}{T_2} + \frac{2\tau^3}{3}\gamma^2 G_i^2 D + \gamma^2 g^2 D\delta^2\left(\tau - \frac{\delta}{3}\right) \quad (L9)$$

the attenuation may be written $$I = I_0 e^{-n \cdot K} \quad (L10)$$

Terms including relaxation, diffusion due to internal magnetic field gradients and diffusion terms due to applied magnetic field gradients, are thus collected as one unknown, K.

To separate between NMR-signal from fat/oil and the other components, one makes use of the difference in mobility and transverse relaxation time. Fat/oil has significant different mobility from water and sugar dissolved in water. By adjusting the applied field gradient pulse such that water signal and possible signal from sugar dissolved in water is suppressed at the first echo, then the m-PFGSE-experiment can be used to quantify the fat(oil) directly. Due to the very short transverse relaxation times (<1 ms) of protein and solid sugar, their NMR-signal will not contribute when the first measuring point (n=0) in the m-PFGSE experiment is at 5 ms or more. The attenuation can then be written $$I = I_{fat} e^{-n \cdot K_{fat}} \quad (L11)$$

A weighted linear adjustment of the logarithm of L11 to the function $$y = -ax + c \quad (L12)$$

yields a value for c where $$I_{fat} = e^c \quad (L13)$$

By weighting the adjustment one takes into consideration that the model in (L11) is not valid at all times. When the observation time approaches 0 (n->0), the validity will increase. The first measuring points are therefore given more weight than the last ones.

Diffusion and relaxation effects in the NMR-signal is now corrected for, and the signal is meant to a measure for the content of fat(oil) on the sample.

Figure 3:
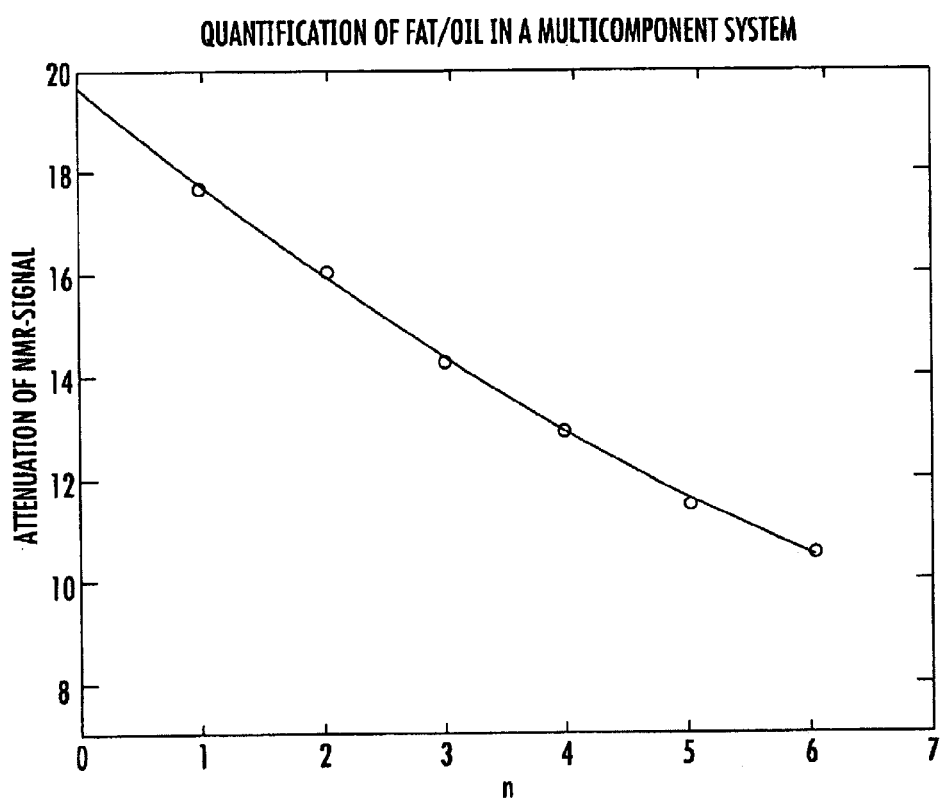
FIG. 3 is a graph showing the attenuation of the NMR signal in relation to the fat/oil content of a sample.

The method is tested on homogenised salmon, herring and mackerel. Typical experimental results for homogenised herring is shown in FIG. 3. Control measurements have been performed using ethylacetate as solvent in an extraction method of fat/oil. The results from the two different methods are found in table 1.

TABLE I

NMR-results for fat content in different types of fish compared with an extraction method.

|  | Fat content by the NMR-method/% | Fat content by extraction/% |
|---|---|---|
| Wild salmon | 5.5 +/− 0.1 | 5.3 |
| Bred salmon | 11.1 +/− 0.2 | 10.9 |
| Herring | 17.2 +/− 0.2 | 16.9 |
| Mackerel | 30.0 +/− 0.4 | 29.8 |

A number of embodiments of the present invention have been described. Nevertheless, it will be understood that various modifications may be made without departing from the spirit and scope of the invention. Accordingly, it is to be understood that the invention is not to be limited by the specific illustrated embodiment but only by the scope of the appended claims.

What is claimed is:

1. A method of determining the amount of fat/oil in a multicomponent sample system using nuclear magnetic resonance spectroscopy, comprising the steps of:
   a) providing a sample containing a multicomponent system,
   b) placing said sample in a nuclear magnetic sprectroscope,
   c) applying a homogenous/static magnetic field affected by an oscillating magnetic field, and a magnetic field gradient in a multi-pulsed magnetic field gradient spin echo experiment to said multicomponent sample, wherein said applied gradient is the same gradient strength throughout said experiment,
   d) measuring changes in nuclear magnetic moment(s), vector(s)/spin(s) of a group of protons in said multicomponent sample,
   e) adjusting said measured signal from said sample at the first echo by suppressing the contribution from the non-fat compounds in said multicomponent system by fitting said measured signal as a function of the number of echoes, and
   f) thus obtain a spectrograph of the amount of fat/oil at zero observation time.

2. A method of claim, 1 in which said adjusting comprises taking the first echo after five milliseconds such that the attenuation of the signal I in the multi-pulsed magnetic field gradient spin echo experiment becomes $$I = I_{fat} e^{-nK_{fat}},$$

and then performing a linear adjustment of the logarithm of the signal I to the function y=−ax+c such that the fat content becomes $I_{fat}=e^c$.

* * * * *